US009869709B2

(12) United States Patent
Belhaja et al.

(10) Patent No.: US 9,869,709 B2
(45) Date of Patent: Jan. 16, 2018

(54) ELECTRIC ARC DETECTION METHOD AND DEVICE

(71) Applicant: Schneider Electric Industries SAS, Rueil-Malmaison (FR)

(72) Inventors: Zakaria Belhaja, Grenoble (FR); Simon Tian, Eybens (FR); Clement Zeller, Grenoble (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 691 days.

(21) Appl. No.: 14/300,328

(22) Filed: Jun. 10, 2014

(65) Prior Publication Data
US 2014/0379283 A1 Dec. 25, 2014

(30) Foreign Application Priority Data

Jun. 21, 2013 (FR) ..................... 13 55914

(51) Int. Cl.
| | | |
|---|---|---|
| *H01H 9/50* | (2006.01) | |
| *H01H 33/26* | (2006.01) | |
| *G06F 17/00* | (2006.01) | |
| *G01R 31/02* | (2006.01) | |
| *G01R 31/12* | (2006.01) | |
| *H02H 1/00* | (2006.01) | |

(52) U.S. Cl.
CPC ....... *G01R 31/025* (2013.01); *G01R 31/1272* (2013.01); *H02H 1/0015* (2013.01); *H02H 1/0092* (2013.01)

(58) Field of Classification Search
CPC ... H04L 7/042; H04B 1/70752; H04B 1/7093; G01R 31/025; G01R 31/1227; H02H 1/0015

USPC ........ 361/2, 42, 93.1; 375/343, 150; 702/17, 702/58, 190
See application file for complete search history.

(56) References Cited

U.S. PATENT DOCUMENTS

| | | | |
|---|---|---|---|
| 5,452,223 A | 9/1995 | Zuercher et al. | |
| 5,561,605 A | 10/1996 | Zuercher et al. | |
| 5,602,709 A * | 2/1997 | Al-Dabbagh | H02H 1/0015 324/520 |

(Continued)

FOREIGN PATENT DOCUMENTS

GB     2 348 751     10/2000

OTHER PUBLICATIONS

French Preliminary Search Report dated Mar. 28, 2014 in French Application 13 55914, filed on Jun. 21, 2013 ( with English Translation of categories of Cited Documents).

(Continued)

*Primary Examiner* — Toan Le
*Assistant Examiner* — Jeffrey Aiello
(74) *Attorney, Agent, or Firm* — Oblon, McClelland, Maier & Neustadt, L.L.P.

(57) ABSTRACT

An electric arc detection device samples first, second and third filterings of a signal in a current window and in another window. A correlation is determined between first filtering samples of the current and the other window, a correlation is determined between second filtering samples of the current and the other window, and a correlation is determined between third filtering samples of the current window and the other window. An arc is then detected as a function of the correlations.

13 Claims, 7 Drawing Sheets

(56) References Cited

U.S. PATENT DOCUMENTS

| | | | |
|---|---|---|---|
| 6,625,550 B1 | 9/2003 | Scott et al. | |
| 6,873,161 B1* | 3/2005 | Meckler | G01R 31/1272 324/512 |
| 7,345,860 B2 | 3/2008 | Wong | |
| 8,054,591 B2* | 11/2011 | Changali | H02H 1/0015 361/115 |
| 2003/0227290 A1 | 12/2003 | Parker | |
| 2006/0114627 A1 | 6/2006 | Wong | |
| 2006/0203401 A1* | 9/2006 | Kojori | H02H 1/0015 361/42 |
| 2008/0204950 A1* | 8/2008 | Zhou | H02H 1/0015 361/42 |
| 2009/0161270 A1 | 6/2009 | Beatty, Jr. et al. | |
| 2009/0284265 A1* | 11/2009 | Ohta | H02H 1/0015 324/536 |
| 2010/0020451 A1* | 1/2010 | Changali | H02H 1/0015 361/42 |
| 2010/0157488 A1* | 6/2010 | Hall | H02H 1/0015 361/42 |
| 2014/0062500 A1* | 3/2014 | Behrends | G01R 31/024 324/537 |
| 2014/0168843 A1* | 6/2014 | Privitera | G01R 31/025 361/93.1 |

OTHER PUBLICATIONS

J. Veen et al "The Application of Matched Filters to PD Detection and Localization", IEEE Electrical Insulation Magazine, 2003, 7 pages.

* cited by examiner

ELECTRIC ARC DETECTION METHOD AND DEVICE

The present invention relates to electric arc detection in an electrical installation through a correlation calculation applied to frequency samples. Such detection makes it possible to stop the circulation of electrical current if necessary, in order to prevent the electrical installation from being damaged.

More specifically, the present invention relates to an electric arc detection method in an electrical installation providing an electrical signal, comprising the following steps respectively carried out in a current window of a plurality of time windows for observing the electrical signal:

i/ applying, to said electrical signal in parallel with at least one first filtering centered on a first frequency, a second filtering centered on a second frequency and a third filtering centered on a third frequency, said first, second and third frequencies being distinct;

ii/ determining, for said window, at least samples resulting from the first filtering, samples resulting from the second filtering and samples resulting from the third filtering;

iii/ determining the correlation between said samples determined for the current window and samples determined following the implementation of steps i/ and ii/ for at least one other window from the plurality of time windows for observing the electric signal; and iv/ detecting the presence of an electric arc as a function of at least said determined correlation.

Certain techniques, for example those described in document U.S. Pat. No. 7,345,860, detect an arc by implementing a step for recognizing the type of charges present on the electrical installation, from signals resulting from the filtering of the electrical signal by three bandpass filters arranged in parallel.

Other techniques avoid this charge recognition step by basing themselves on the responses of the three filters. One difficulty is related to the presence of a noise generated by certain charges, such as light dimmers.

Applying a correlation calculation makes it possible to detect the random aspect of this noise and limit false electric arc detections due to such noise. A signal adding the outputs of the three filters over a duration of an observation cycle is determined on the condition that the output of each of the filters is strictly positive, and the correlation between that signal and the signal corresponding to another cycle is calculated. Thus, a correlation, above a given threshold, and obtained for strictly positive values of the output of each of the filters, may be a sign that an arc is present.

The present invention aims to improve electric arc detection.

To that end, according to a first aspect, the invention proposes an electric arc detection method of the aforementioned type, characterized in that step iii/ for determining the correlation comprises determining at least one respective correlation from among:

a first correlation between said samples resulting from the first filtering and determined for the current window and samples resulting from the first filtering and determined for the other window;

a second correlation between said samples resulting from the second filtering and determined for the current window and samples resulting from the second filtering and determined for the other window;

a third correlation between said samples resulting from the third filtering and determined for the current window and samples resulting from the third filtering and determined for the other window; and in that step iv/ for detecting the presence of an arc depends on at least the correlation determined from among said first, second and third correlations.

The invention thus makes it possible to take the correlation of the signal at the output of each filter into account independently and to detect the presence of an arc on that basis. This arrangement makes it possible to reduce the risk of distorting the arc detection relative to a detection technique based on a correlation determined on the sum of the signals provided by the three filters.

Furthermore, the correlation was only calculated when the samples were strictly greater than zero at the output of each of the three filters. However, arc signatures exist according to which only one or two responses are provided by all of the three filters.

In embodiments, the method according to the invention further includes one or more of the following features:

step iv/ for detecting the presence of an arc is a function of the comparison of the determined correlation from among said first, second and third correlations, with a threshold;

step iii/ for determining the correlation comprises determining at least each of said first, second and third respective correlations;

step iv/ for detecting the presence of an arc is a function of at least each of said first, second and third correlations;

the difference between said respective correlation determined among said first, second and third correlations for one window and said respective correlation for another window is calculated, step iv/ for detecting the presence of an arc being a function of at least said calculated difference;

the number of successive samples with a value greater than zero is calculated among the samples resulting from a respective filtering among the first, second and third filterings, for the current window, said number is compared to a threshold, the presence of an electric arc is detected as a function of at least said comparison;

none of said first, second and third frequencies are equal to an integer that is a multiple of another of said frequencies.

According to a second aspect, the present invention proposes a computer program for detecting an electric arc including instructions for implementing the steps of a method according to the first aspect of the invention, when the program is run by computation means.

According to a third aspect, the present invention proposes a device for detecting an electric arc, in an electrical installation providing an electrical signal, comprising a filtering-sampling unit suitable, during a time window for observing the electric signal, for filtering said signal in parallel according to a first filtering centered on a first frequency, according to a second filtering centered on a second frequency, and according to a third filtering centered on a third frequency, said first, second and third frequencies being distinct, and for determining, for said time window for observing the signal, signal samples resulting from the first filtering, signal samples resulting from the second filtering and signal samples resulting from the third filtering;

the detection device further comprising a processing unit suitable for determining a correlation between said samples determined for a current time window for observing the electrical signal and samples determined for at least one other time window for observing the electrical signal, and for detecting the presence of an electric arc as a function of at least said determined correlation;

said device being characterized in that the processing unit is suitable for determining said correlation by determining at least one respective correlation from among:

a first correlation between said signal samples resulting from the first filtering determined for the current window and signal samples resulting from the first filtering determined for the other window;

a second correlation between said signal samples resulting from the second filtering determined for the current window and signal samples resulting from the second filtering determined for the other window;

a third correlation between said signal samples resulting from the third filtering determined for the current window and signal samples resulting from the third filtering determined for the other window; and in that the processing unit is suitable for detecting the presence of an arc as a function of at least the correlation determined from among said first, second and third correlations.

These features and advantages of the invention will appear upon reading the following description, provided solely as an example, and done in reference to the appended drawings, in which.

Figure 1:
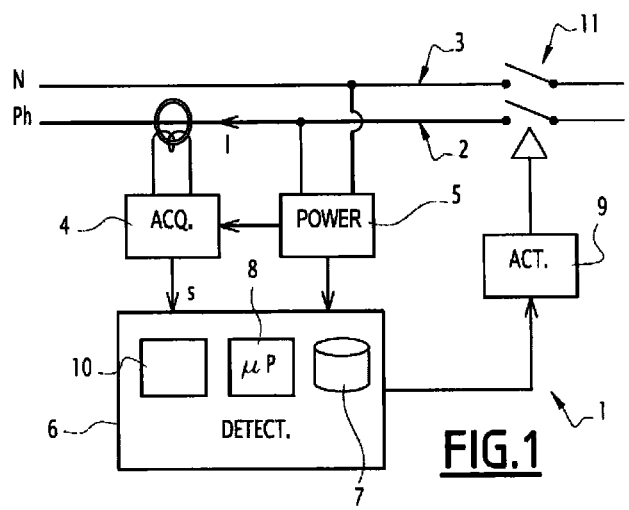
FIG. 1 shows an electrical installation provided with an electric arc detecting device in one embodiment of the invention.

In FIG. 1, an electrical installation 1, in one embodiment of the invention, is shown. This electrical installation includes a phase conductor 2 and a neutral conductor 3. It further includes an acquisition system 4, a power supply unit 5, an electric arc detecting device 6, hereinafter referred to as "detection module", and an actuator 9.

The acquisition system 4 is suitable for acquiring values of at least one electrical property representative of the electrical installation, in particular a current or voltage value.

For example, in the considered case, the acquisition system 4 comprises a current sensor delivering a signal s representative of a line current i circulating in the electrical installation, for example a phase current, using a current measuring toroid. In embodiments, this signal is representative of the time derivative of the current i, di/dt, or the electrical voltage of the power supply.

This electrical signal s is provided at the input of the detection module 6.

The detection module 6 includes a set 10 of bandpass filters, a microprocessor 8 and a database 7.

In the present case, the set 10 of bandpass filters includes three bandpass filters $F_1$, $F_2$ and $F_3$.

The detection module 6 is suitable for performing processing operations from the signal s that is provided to it as input, so as to detect the presence or absence of an electric arc, in the electrical installation 1, and to command activation or non-activation of the actuator 9 as a function of those processing operations.

The actuator 9 is suitable, as a function of commands received from the detection module 6, for interrupting, for example by opening switches 11 positioned on the conductors 2, 3, or allowing the circulation of the current in the electrical installation 1, for example by leaving the switches closed.

The memory 7 of the detection module 6 is suitable for storing the values of various parameters, and of the filtered samples defined below, as well as software instructions defining functions and steps outlined below and implemented by the detection module 6 when the software instructions are executed by the microprocessor 8.

Figure 2:
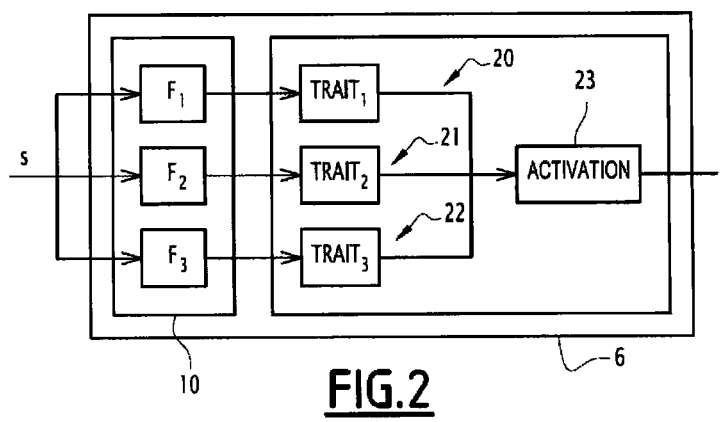
FIG. 2 is a view of functional modules of the electric arc detecting device in one embodiment of the invention.

In reference to FIG. 2, the detection module 6 thus includes 3 processing chains 20, 21, 22 acting in parallel from the signal s, and an activation unit 23 to which the results of the processing chains are provided.

The first processing chain 20 includes the filter $F_1$, followed by a processing module $TRAIT_1$.

The second processing chain 21 includes the filter $F_2$, followed by a processing module $TRAIT_2$.

The third processing chain 22 includes the filter $F_3$, followed by a processing module $TRAIT_3$.

Each filter $F_n$ is a bandpass filter centered on the frequency $f_n$, n=1 to 3.

For example, none of these frequencies $f_n$ is an integer multiple of another of these frequencies $f_n$. The frequencies $f_n$ are chosen in the range of 10 kHz-100 kHz.

In the considered embodiment, each filter $F_n$ is of the switched capacity type. The output voltage V of the filter is therefore the result of the filtering and sampling of the signal s provided to it as input. In other embodiments, the sampling is done at the input of the processing module.

In the considered case, each filter $F_n$ is suitable for providing, during an $i^{th}$ considered detection cycle with duration T, for the signal s, N samples with voltage V, representative of the frequency component $f_n$ of the signal s.

In the described embodiment, the sampling frequency is 4 kHz.

Figure 3:
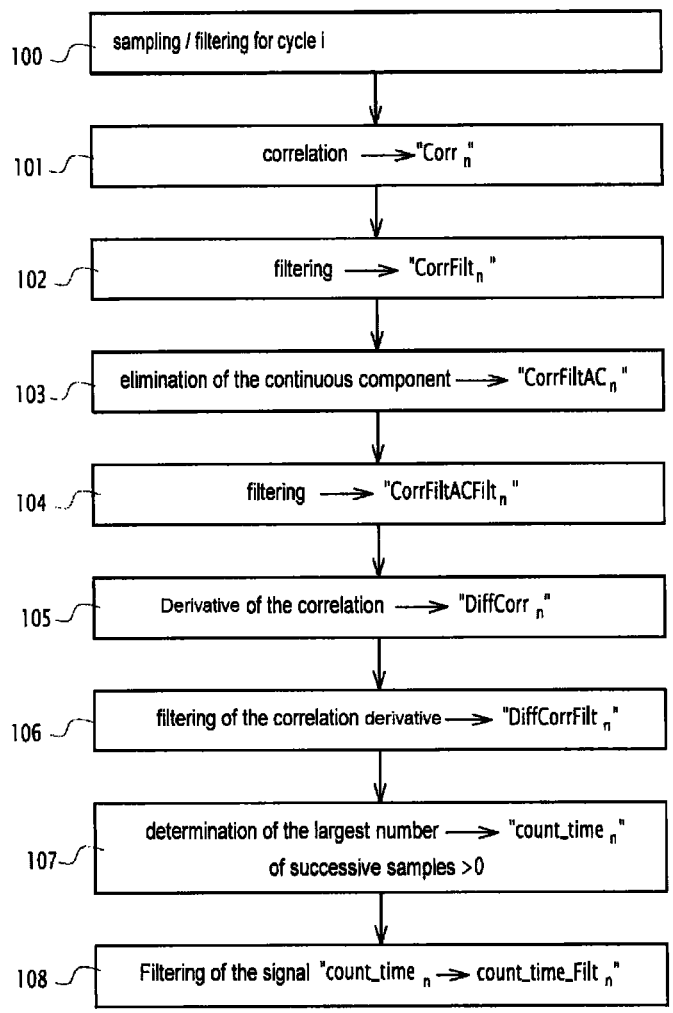
FIG. 3 is a flowchart of an electric arc detection method in one embodiment of the invention.

Thus, in reference to the flowchart shown in FIG. 3, in the considered case, in a step 100, during the $i^{th}$ cycle, the filter $F_n$ with n=1 to 3 delivers the samples $Ech_{n,i}(j)$, j=0 to 37, to the processing chain $TRAIT_n$ whereof the processing operations relative to the identification of the presence of noise characteristic of an arc will allow the activation unit 23 to determine the presence or absence of an electric arc.

The processing module $TRAIT_n$ is suitable for carrying out the processing steps indicated below in reference to FIG. 3, with n=1 to 3, so as to obtain the values, for the $i^{th}$ cycle, of the following parameters, in particular:

$Corr_n[i]$;
$CorrFilt_n[i]$;

CorrFiltAC$_n$[i];
CorrFiltACFilt$_n$[i];
DiffCorr$_n$[i];
DiffCorrFilt$_n$[i];
count_time_Filt$_n$[i].

In a step 101, the correlation between distinct cycles, for example the $i^{th}$ current cycle and the $(i-2)^{th}$ cycle, for the frequency $f_n$, is calculated, so as to detect a non-periodic behavior. For example, one first calculates, for j=0 to 37, |Ech$_{ni}$(j)−Ech$_{n(i-2)}$(j)|, then one deduces Corr$_n$ therefrom for the cycle i:

$$Corr_n[i] = \sum_{j=0}^{37} |Ech_{ni}(j) - Ech_{n(i-2)}(j)|.$$

Figure 4:
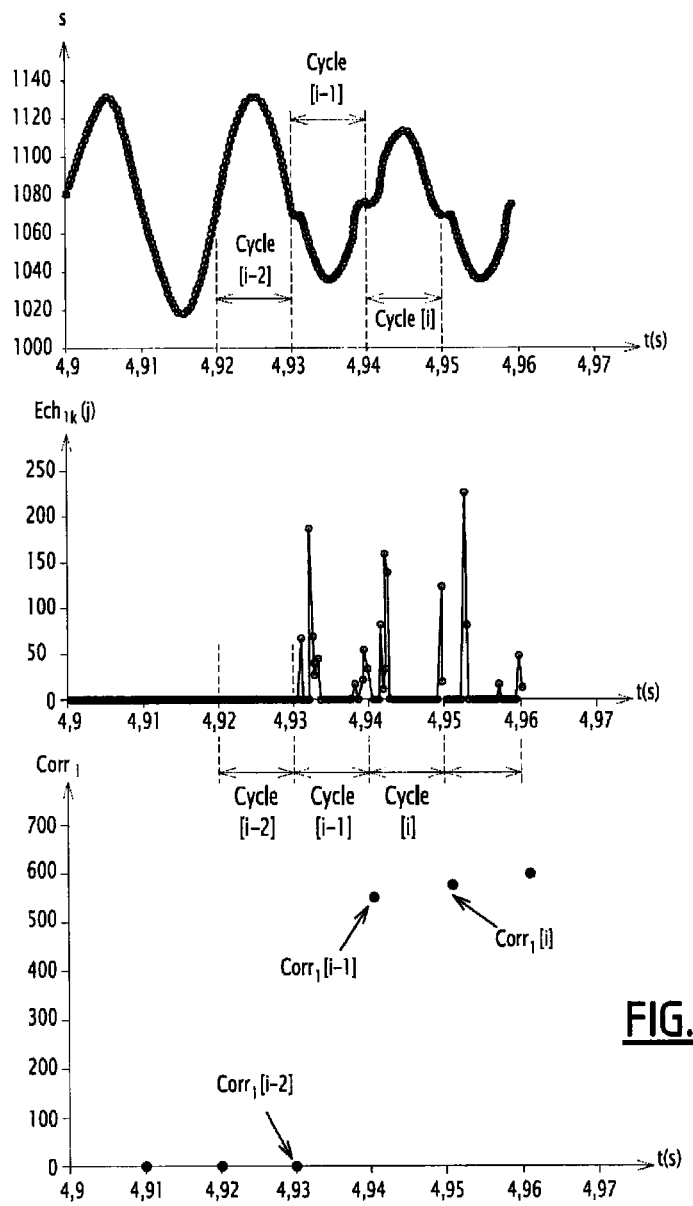
FIG. 4 shows the evolution over time, for successive cycles, of the signal s, the samples at the output of the filter $F_1$ and the value of a corresponding correlation parameter.

As an illustration, the top graph in FIG. 4 shows the signal s obtained between successive cycles k=i−3 to i, as a function of the time t expressed in seconds (s).

The middle graph in FIG. 4 shows the samples Ech$_{1k}$(j) with j=0 to 37, obtained between successive cycles k=i−3 to i, as a function of the time t expressed in seconds (s).

The bottom graph of FIG. 4 shows the correlation Corr$_1$ obtained between successive cycles i−3 to i, as a function of the time t expressed in seconds (s).

In a step 102, in order to ensure a repetitive behavior of the detection and control the activation time to open the actuator 9, a low pass filter is applied to the correlation thus computed, delivering the value of the parameter CorrFilt$_n$[i] for the cycle i.

A low pass filter is applied to the parameter CorrFilt$_n$[i] thus computed, delivering the value of the parameter CorrFiltFilt$_n$[i] for cycle i.

The transfer function of the low pass filter is of the first order:

$Y(n+1)=2^{-w}.X(n)+(1-2^{-w}). Y(n)$, where w is a positive integer.

Figure 5:
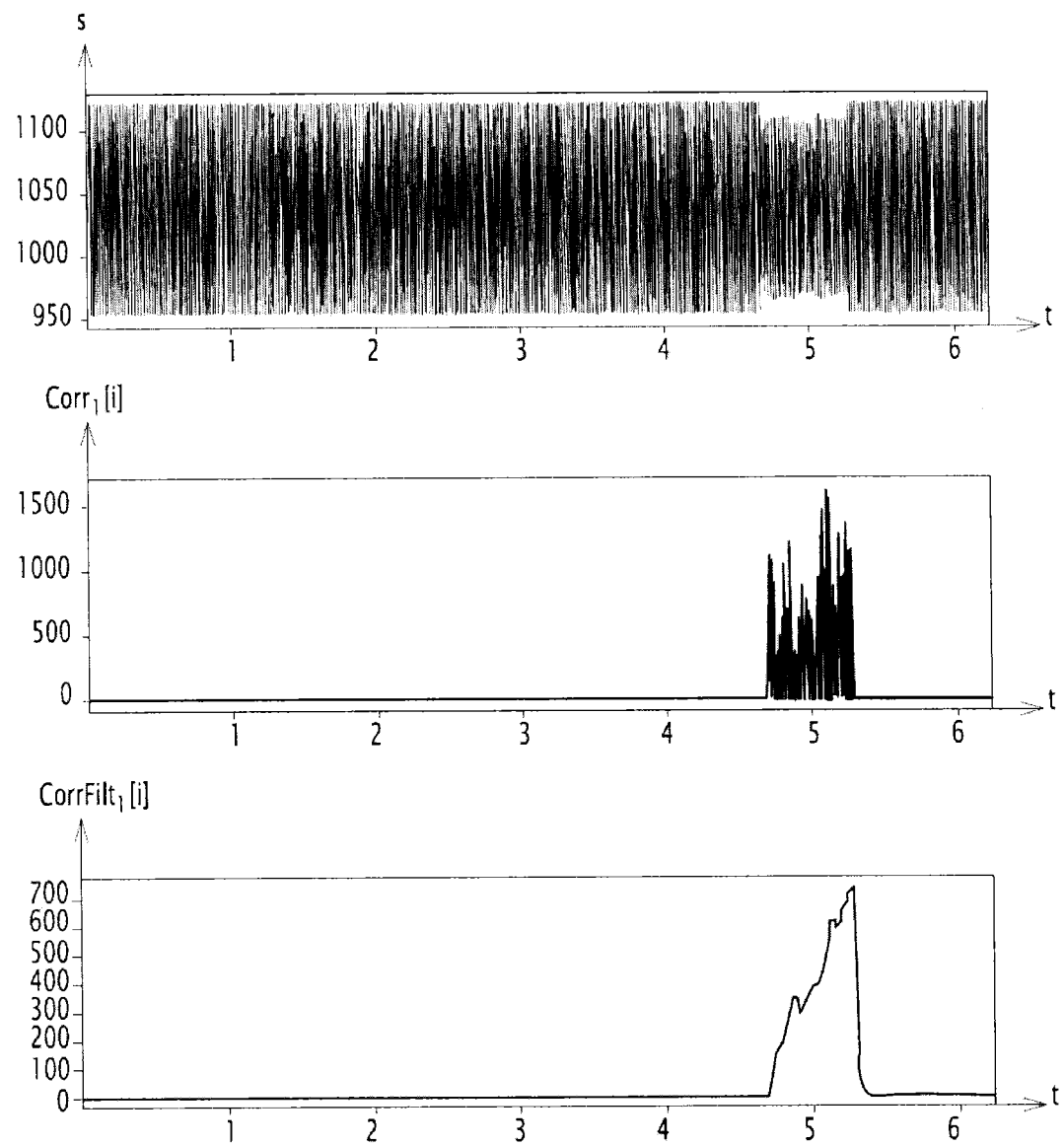
FIG. 5 shows the evolution over time, for successive cycles, of the signal s, the correlation of the samples at the output of the filter $F_1$ and that correlation filtered by a low pass filter.

As an illustration, the top graph of FIG. 5 shows the signal s obtained for successive temporal cycles along the time axis expressed in seconds (s).

The middle graph of FIG. 5 shows the correlation values Corr$_1$ obtained for successive temporal cycles along the time axis expressed in seconds (s), in reference to the low frequency $f_1$.

The bottom graph of FIG. 5 shows the filtered correlation CorrFilt$_1$ obtained in reference to the low frequency $f_1$, for successive temporal cycles along the time axis expressed in seconds (s).

In certain cases, the result of the correlation before an arc is different from zero, and the correlation value increases when the arc appears.

In a step 103, in order to force the correlation to zero before an arc (the correlation being different from zero after the arc), this pre-arc correlation, called continuous component, is eliminated by subtracting the parameter CorrFiltFilt$_n$[i] from the parameter CorrFilt$_n$[i]. The result yields the parameter CorrFiltAC$_n$ called, for the considered cycle i: CorrFiltAC$_n$[i].

In a step 104, additional filtering makes it possible to smooth the obtained signal and avoid frequent passages past zero, delivering the parameter CorrFiltACFilt$_n$, or for the considered cycle i: CorrFiltACFilt$_n$[i].

The transfer function of the low pass filter used is of the first order:

$Y(n+1)=2^{-m}.X(n)+(1-2^{-m}). Y(n)$, with m a positive integer.

Figure 6:
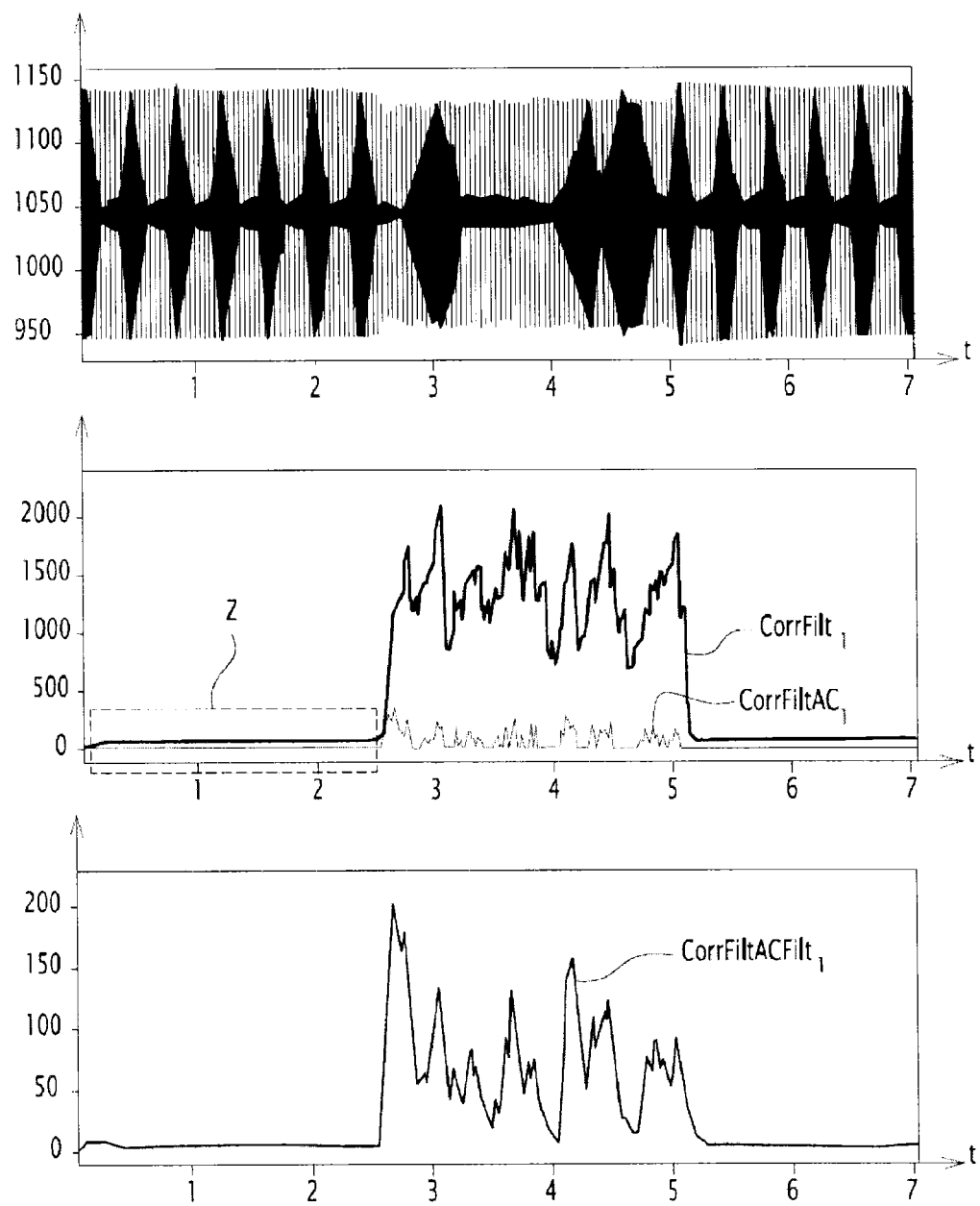
FIG. 6 shows the evolution over time, for successive cycles, of the signal s and different parameters $CorrFilt_1$, $CorrFiltAC_1$ and $CorrFiltACFilt_1$, obtained from the correlation of the samples at the output of the filter $F_1$.

As an illustration, the top graph of FIG. 6 shows the signal s obtained for successive temporal cycles along the time axis expressed in seconds (s).

The middle graph of FIG. 6 shows the filtered correlation values CorrFilt$_1$ and those obtained after eliminating the continuous component, i.e., CorrFiltAC$_1$ obtained for successive temporal cycles along the time axis expressed in seconds (s), in reference to the low frequency $f_1$ (the values of CorrFRAC$_1$ are indeed zero in the zone Z).

The bottom graph of FIG. 6 shows the filtered correlation after eliminating the continuous component, i.e., CorrFiltACFilt$_1$, obtained in reference to the low frequency $f_1$, for successive temporal cycles along the time axis expressed in seconds (s).

In a step 105, so as to be able to differentiate between transitional ratings and the appearance of an arc, the derivative of the correlation is calculated (the correlation being expressed by one of the previously determined correlation parameters Corr$_n$, CorrFilt$_n$, CorrFiltAC$_n$[i] or CorrFiltACFilt$_n$), which amounts to applying a high pass filter.

One thus calculates DiffCorr$_n$[i]=|CorrFilt$_n$[i]−CorrFilt$_n$[i−1].

Next, in a step 106, a low pass filter is applied to DiffCorr$_n$ to smooth the signal and avoid frequent passages past zero. The signal provided at the output of that filter for the cycle i is DiffCorrFiltn[i].

The transfer function of the low pass filter is of the first order:

$Y(n+1)=2^{-t}.X(n)+(1-2^{-t}). Y(n)$, where t is a positive integer.

Figure 7:
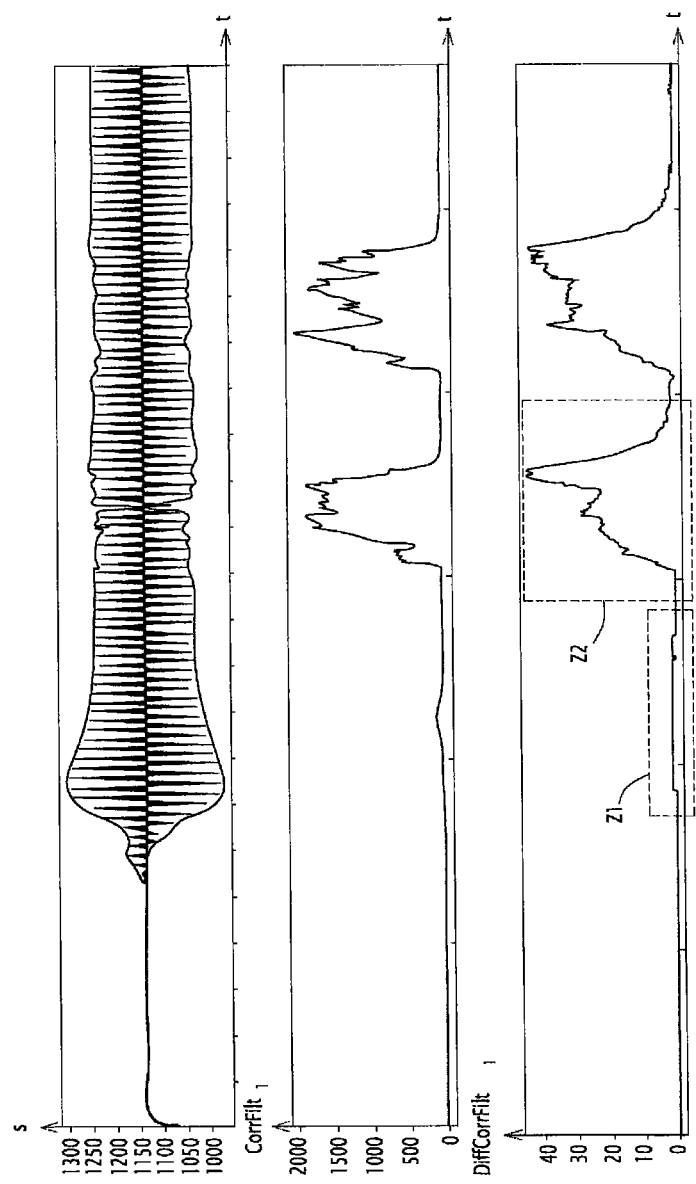
FIG. 7 shows the evolution over time, for successive cycles, of the signal s and of different parameters $CorrFR_1$ and $DiffCorrFilt_1$ obtained from the correlation of the samples at the output of the filter $F_1$.

As an illustration, the top graph of FIG. 7 shows the signal s obtained for successive temporal cycles along the time axis expressed in seconds (s).

The middle graph of FIG. 7 shows the values representative of the correlation (in the considered case, the correlation is represented by the parameter CorrFilt$_1$) obtained for successive temporal cycles along the time axis expressed in seconds (s), in reference to the low frequency $f_1$.

The bottom graph of FIG. 7 shows the filtered derivative of the correlation DiffCorrFilt$_1$, obtained at the end of steps 105 and 106, this time based on the parameter representative of the correlation, CorrFilt$_1$, in reference to the low frequency $f_1$, for successive temporal cycles along the time axis expressed in seconds (s).

On this bottom graph, it is then possible to see the zone Z1 corresponding to zero values or values very close to zero of DiffCorrFilt$_1$, which is a transitional rating, zone Z2 in which the values of DiffCorrFilt$_1$ are non-zero and much higher than the values in the transitional rating, and which is representative of the presence of an arc.

Furthermore, observing the distribution of the samples delivered by a filter $F_n$, n=1 to 3 on the one hand, and the number of the samples strictly greater than zero on the other hand, makes it possible to differentiate between a normal operating mode and an arc fault.

In particular, more frequent passages past the zero value of the samples occur when an arc is present.

To that end, in a step 107, for n=1 to 3, the value of the parameter count_time$_n$[i], which is equal to the largest number of successive samples greater than zero, is determined for the current cycle i during the cycle. This arrangement makes it possible to detect the shape of the distribution of the samples obtained for each frequency $f_n$.

In a step 108, a filter is next applied to the signal count_time$_n$ to smooth the signal and avoid passages by zero.

The transfer function of the low pass filter is of the first order:

$Y(n+1)=2^{-v}.X(n)+(1-Y(n)$, where v is a positive integer.

The parameter count_timeFiltn[i] is delivered at the output of that filter.

Figure 8:
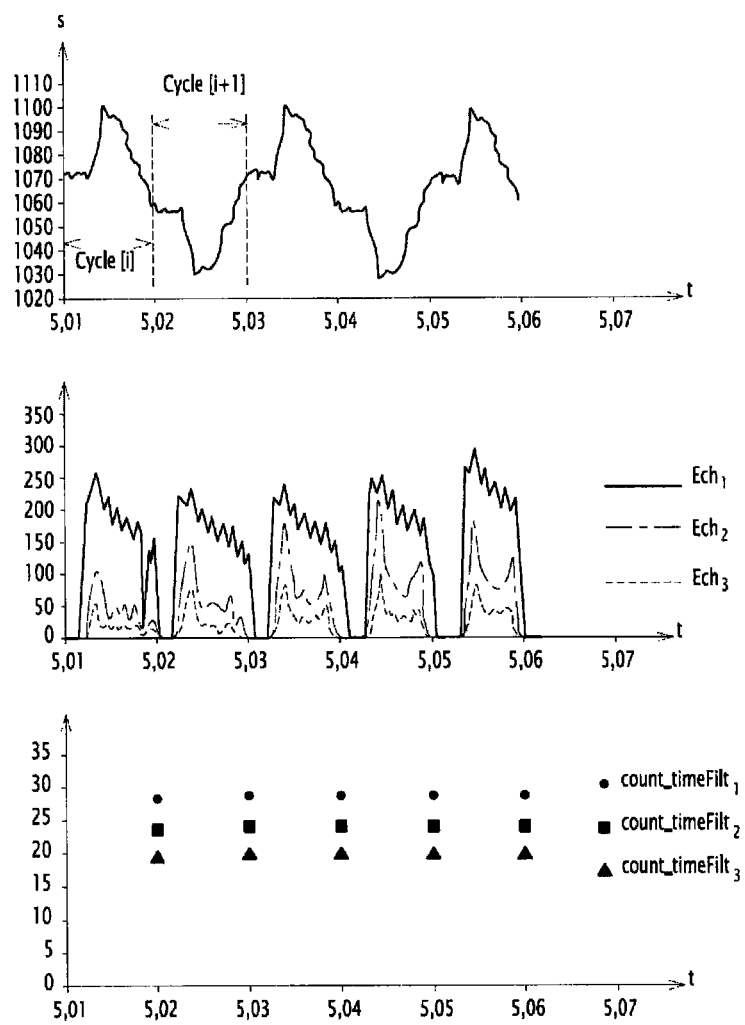
FIG. 8 shows the evolution over time, for successive cycles k=i, i+1 etc., of the signal s, of the 38 samples per cycle k $Ech_{1k}$, $Ech_{2k}$, $Ech_{3k}$, and the parameters count_timeFilt$_1$, count_timeFilt$_2$, count_timeFilt$_3$ computed for those cycles.

As an illustration, the top graph of FIG. 8 shows the signal s obtained for successive time cycles along the time axis expressed in seconds (s).

The middle graph in FIG. 8 shows the evolution over time, for successive cycles k=i, i+1 etc., of the signal s, samples $Ech_{1k}$ at the output of the filter $F_1$ (in solid lines), $Ech_{2k}$ at the output of the filter $F_2$ (in broken lines), $Ech_{3k}$ at the output of the filter $F_3$ (in dotted lines).

The bottom graph in FIG. 8 shows the evolution over time, for successive cycles k–i, i+1, etc., of the parameters count_timeFilt$_1$ (circles), count_timeFilt$_2$ (squares), count_timeFilt$_3$ (triangles) computed for those cycles.

As indicated above, the number of successive samples at the output of the filter having a value different from zero may provide discriminatory information regarding the presence of an arc. In particular, a zero value, or on the contrary a very high value, is generally synonymous with the absence of an arc.

In another embodiment, the counting of the successive values different from zero is done over the duration of a cycle portion, for example a half-cycle, in place of the duration of a cycle. This allows the earliest possible detection of the presence of an arc.

The parameters computed for the $i^{th}$ considered cycle for the three processing chains 20, 21, 22 respectively associated with the low, medium and high frequencies $f_1$, $f_2$ and $f_3$ are delivered to the activating unit 23.

The activating unit is suitable for detecting the presence or absence of an arc as a function of at least some of these parameters computed for at least the cycle i, considered independently for each frequency and/or combined with each other for a given frequency and/or combined with each other for several frequencies, and for sending a command to open the switches 11 to the actuator 9 when an arc is detected.

In one embodiment, this detection is done as a function of rules applied to these parameters.

These rules may apply to the parameters considered independently by frequency $f_1$, $f_2$ or $f_3$, or the parameters may be combined for a given frequency and/or the parameters may be combined for several frequencies.

For example, the rules may comprise the following rules, applied over a single cycle i, or in combination taking their application over several cycles into account:

Rule 1: if CorrFiltACFilt$_1$>SeuilCorr$_1$ OR if CorrFiltACFilt$_2$>SeuilCorr$_2$ OR if CorrFiltACFilt$_3$>SeuilCorr$_3$: the presence of an arc is detected (the values of SeuilCorr$_n$, n=1 to 3 are predetermined thresholds);

Rule 2: if DiffCorrFilt$_1$ OR DiffCorrFilt$_2$ OR DiffCorrFilt$_3$ is non-zero: the presence of an arc is detected.

Rule 3: if count_time_Filt$_1$ OR count_time_Filt$_2$ OR count_time_Filt$_3$<seuil_count: the presence of an arc is detected;

Rule 4: if CorrFiltACFilt1>SeuilCorr1 and if CorrFiltACFilt2>SeuilCorr2 and if CorrFiltACFilt3>SeuilCorr3: the presence of an arc is detected (the values of SeuilCorrn, n=1 to 3, are predetermined thresholds);

Rule 5: if CorrFiltACFilt1>SeuilCorr1 Or (if CorrFiltACFilt2>SeuilCorr2 and if CorrFiltACFilt3>SeuilCorr3): the presence of an arc is detected (the values of SeuilCorrn, n=1 to 3, are predetermined thresholds);

Rule 6: if (CorrFiltACFilt1>SeuilCorr1 and if CorrFiltACFilt2>SeuilCorr2) Or if CorrFiltACFilt3>SeuilCorr3: the presence of an arc is detected (the values of SeuilCorrn, n=1 to 3 are predetermined thresholds);

Rule 7: (if CorrFiltACFilt1>SeuilCorr1 and CorrFiltACFilt3>SeuilCorr3) Or if CorrFiltACFilt2>SeuilCorr2 and if: the presence of an arc is detected (the values of SeuilCorrn, n=1 to 3 are predetermined thresholds);

Rule 8: if CorrFiltACFilt1>SeuilCorr1 and if CorrFiltACFilt2>SeuilCorr2 and if DiffCorrFilt3 is non-zero and if count_time_Filt2<seuil_count: the presence of an arc is detected (the values of SeuilCorrn, n=1 to 3 are predetermined thresholds);

These rules are only examples. An infinite number of rules can be determined, combining certain parameters computed above and optionally other criteria.

According to the invention, the value of at least some of the different computed parameters relative to each frequency $f_1$, $f_2$, $f_3$ and, if applicable, the comparison with thresholds, make it possible to detect arcs that were not perceived using the techniques of the prior art.

In the considered embodiment, the electrical installation included a phase conductor and neutral conductor, but the invention may of course be implemented for any type of electrical installation, for example an installation with 3 phase conductors and one neutral conductor.

In the described embodiment, the set of filters included three filters. The number of filters may be 3 or more (it is possible to perform an arc detection with a single filter, but for robustness reasons 3 are used, therefore the number of filters >=3 risks limiting the coverage of the patent), as well as the number of processing chains operating in parallel on the signal upstream from the activation unit 23.

In the embodiment, the bandpass filters have a switched capacity and perform the filtering and sampling. In other embodiments, the filtering and sampling may be done separately.

In embodiments, only some of the steps described above are carried out. It is not necessary for all of the indicated parameters to be calculated, and other parameters may be taken into account for the detection.

The invention claimed is:

1. An electric arc detection method in an electrical installation providing an electrical signal, comprising the following steps respectively carried out in a current window of a plurality of time windows for observing the electrical signal:

measuring values of the electrical signal, the electrical signal being representative of a current circulating in the electrical installation;

applying to said electrical signal in parallel at least one first filtering centered on a first frequency, a second filtering centered on a second frequency and a third filtering centered on a third frequency, said first, second and third frequencies being distinct;

determining, for said current window, at least samples resulting from the first filtering, samples resulting from the second filtering and samples resulting from the third filtering;

determining a correlation between said samples determined for the current window and samples determined following the applying and determining steps for at least one other window from the plurality of time windows for observing the electric signal;

detecting a presence of an electric arc as a function of at least said determined correlation; and sending a command to an actuator of the electrical installation to interrupt the current circulating in the electrical installation when the presence of the electric arc is detected, wherein determining of the correlation comprises determining al least one respective correlation from among:

a first correlation between said samples resulting from the first filtering and determined for the current window and samples resulting from the first filtering and determined for the at least one other window;

a second correlation between said samples resulting from the second filtering and determined for the current window and samples resulting from the second filtering and determined for the other at least one window;

a third correlation between said samples resulting from the third filtering and determined for the current window and samples resulting from the third filtering and determined for the at least one other window; and detecting the presence of an arc depends on at least the correlation determined from among said first, second and third correlations, wherein:

a number of successive samples with a value greater than zero is calculated among the samples resulting from a respective filtering among the first, second and third filtering, for the current window;

said number is compared to a threshold; and the presence of the electric arc is detected as a function of at least said comparison.

2. The method according to claim 1, wherein detecting the presence of the electric arc is a function of comparison of the determined correlation from among said first, second and third correlations, with a threshold.

3. The method according to claim 1, wherein determining the correlation comprises determining at least each of said first, second and third respective correlations.

4. The method according to claim 3, wherein detecting the presence of the electric arc is a function of-al least each of said first, second and third correlations.

5. The method according to claim 1, wherein a difference between respective correlations determined among said first, second and third correlations for one window and respective correlations for another window is calculated, and detecting the presence of the electric arc is a function of at least said calculated difference.

6. The method according lo claim 1, wherein none of said first, second and third frequencies are equal to an integer that is a multiple of another of said first, second and third frequencies.

7. A non-transitory computer-readable medium storing computer-readable instructions that, when executed by a processor, causes the processor to perform a method according to claim 1.

8. A device for detecting an electric arc, in an electrical installation providing an electrical signal, comprising:

at least one sensor configured to measure values of the electrical signal, the electrical signal being representative of a current circulating in the electrical installation;

a filtering-sampling unit configured to, during a time window for observing the electric signal, filter said signal in parallel according to a first filtering centered on a first frequency, according to a second filtering centered on a second frequency, and according to a third filtering centered on a third frequency, said first, second and third frequencies being distinct, the filtering-sampling unit being further configured to, for said time window for observing the signal, determine signal samples resulting from the first filtering, signal samples resulting from the second filtering and signal samples resulting from the third filtering; and a processor configured to determine a correlation between samples determined for a current time window for observing the electrical signal and samples determined for at least one other time window for observing the electrical signal, the processor being further configured to detect a presence of an electric arc as a function of at least said determined correlation, the processor sending a command to an actuator of the electrical installation to interrupt the current circulating in the electrical installation when the presence of the electric arc is detected, wherein in determining said correlation, the processor determines at least one respective correlation from among:

a first correlation between said signal samples resulting from the first filtering determined for the current window and signal samples resulting from the first filtering determined for the at least one other window;

a second correlation between said signal samples resulting from the second filtering determined for the current window and signal samples resulting from the second filtering determined for the at least one other window;

a third correlation between said signal samples resulting from the third filtering determined for the current window and signal samples resulting from the third filtering determined for the at least one other window; and the processor detects the presence of an arc as a function of at least the correlation determined from among said first, second and third correlations, and wherein the processor is further configured to calculate a number of successive samples with a value greater than zero among the samples resulting from a respective filtering among the first, second and third filtering, for the current window, to compare said number to a threshold, and to detect the presence of the electric arc as a function of at least said comparison.

9. The electric arc detecting device according to claim 8, wherein the processor is further configured to detect the presence of the electric arc as a function a comparison of the determined correlation from among said first, second and third correlations, with a threshold.

10. The electric arc detecting device according to claim 8, wherein in the determination of the correlation, the processor is further configured to determine at least each of said first, second and third respective correlations.

11. The electric arc detecting device according to claim 10, wherein in the determination of the correlation, the processor is further configured to determine at least each of said first, second and third respective correlations.

12. The electric arc detecting device according to claim 8, wherein the processor is further configured to calculate a difference between respective correlation determined among said first, second and third correlations for one window and respective correlation for another window, and detect the presence of the electric arc as a function of at least said calculated difference.

13. The electric arc detecting device according to claim 8, wherein none of said first, second and third frequencies are equal to an integer that is a multiple of another of said first, second and third frequencies.

* * * * *